United States Patent [19]

Ueno et al.

[11] 3,986,896

[45] Oct. 19, 1976

[54] METHOD OF MANUFACTURING SEMICONDUCTOR DEVICES

[75] Inventors: Mituhiko Ueno, Fujisawa; Masataka Hirasawa, Yokohama, both of Japan

[73] Assignee: Tokyo Shibaura Electric Co., Ltd., Japan

[22] Filed: Feb. 28, 1975

[21] Appl. No.: 554,152

[30] Foreign Application Priority Data

Feb. 28, 1974 Japan................................ 49-22796
Feb. 28, 1974 Japan................................ 49-22797

[52] U.S. Cl................................ 148/1.5; 148/187; 148/188; 357/91
[51] Int. Cl.².................. H01L 21/225; H01L 21/26
[58] Field of Search..................... 148/1.5, 187, 188; 357/91

[56] References Cited

UNITED STATES PATENTS

| | | | |
|---|---|---|---|
| 3,391,035 | 7/1968 | Mackintosh ......................... | 148/187 |
| 3,608,189 | 9/1971 | Gray .................................... | 148/187 X |
| 3,673,679 | 7/1972 | Carbajal et al. .................... | 148/188 X |
| 3,764,412 | 10/1973 | Muller et al. ....................... | 148/188 |

OTHER PUBLICATIONS

Kroell et al., "Production of Complementary IG-FETS," IBM Tech. Disc. Bull., vol. 15, No. 5, Oct. 1972, pp. 1623, 1624.

*Primary Examiner*—C. Lovell
*Assistant Examiner*—J. M. Davis
*Attorney, Agent, or Firm*—Oblon, Fisher, Spivak, McClelland & Maier

[57] ABSTRACT

A method of manufacturing semiconductor devices is disclosed which includes the steps of forming an insulating film on one surface of a semiconductor substrate, removing the insulating film selectively to expose at least a portion of one surface of the semiconductor substrate, forming a low temperature oxide film containing a first diffusion source which has a higher etch rate than the insulating film onto at least a part of the exposed surface while leaving the rest of the surface exposed, and heating the substrate to diffuse the first diffusion source film from the oxide film into the substrate and to diffuse a second diffusion source through the exposed surface into the substrate thereby at least two diffused regions can be formed on the substrate without relative displacement.

6 Claims, 25 Drawing Figures

METHOD OF MANUFACTURING SEMICONDUCTOR DEVICES

BACKGROUND OF THE INVENTION

1. Field of the Invention

The present invention relates to a method of manufacturing semiconductor devices and more particularly to improvements which decrease the displacement of elements formed on a substrate due to photolithographic masking and etching techniques.

2. Description of the Prior Art

In forming a plurality of semiconductor elements on a semiconductor substrate, conventional photoetching techniques give rise not only to the critical problem of displacement of each element but also limit miniaturization of the element patterns.

FIG. 1 shows an integrated circuit consisting of complementary inverter circuits and FIGS. 2A through 2F show the conventional method of manufacturing such an integrated circuit.

Referring to the drawings and particularly to FIG. 2A, an N type silicon substrate 1 is shown as including a P type diffused region 2 in which an N type insulated gate FET is to be formed along with an insulating film 30. The P type region 2 is formed by removing the insulating film 30 selectively to make an opening by any of the well known photoetching techniques and then by diffusing a P type impurity where the film 30 has been removed. In this step, an alignment of the photo mask used during the photoetching is not required.

The substrate 1 is then heated to form another insulating film 31 on the surface thereof. The insulating film 31 is selectively removed by photoetching to make openings 32, 33 and 34. Thereafter an N type impurity is diffused from the openings 32, 33 and 34 to make a source region 3, a drain region 4 and a guard ring or stopper 21 (FIG. 2B). In this step, mask alignment is necessary relative to the P type region 2. However, it is assumed that no relative displacement between the P type region 2 and the source 3, drain 4 or stopper 21 has occured.

The substrate 1 is then heated to form an insulating film 35. The insulating film 35 is selectively removed by photoetching to make openings (not shown) and a P type impurity is diffused through the openings to form a source region 5, drain region 6 for the P-channel insilated gate FET and a P type stopper or guard ring 22 (FIG. 2C). In this step, mask alignment is required with respect to the N type regions 3, 4 and 21.

It is assumed that as a result of a misalignment of the mask, the locations of the P type regions 5, 6 and 22 are displaced by $+a$ in the direction X as shown in FIG. 1 with respect to the N type regions 3, 4 and 21.

Thereafter, the substrate 1 is again heated to form an insulating film thereon and then the insulating film is removed by photoetching where a gate electrode is to be formed. After that, the substrate 1 is heated to a high temperature to form thin gate oxide films 9 and 10 (FIG. 2D). In the above photoetching process, the mask alignment is carried out with respect to the N type regions 3, 4 and 21.

It is assumed that the gate oxide films 9 and 10 are displaced by $-a$ in the X direction with respect to the N type regions 3, 4 and 21.

FIG. 2E shows the arrangement after the oxide layer has been partly etched away by photoetching to form openings 11, 12, 13 and 14. In this step, mask alignment is also necessary and let us assume that the openings 11, 12, 13 and 14 are displaced by $-a$ in the X direction with respect to the N type regions 3, 4 and 21.

Then, a conductive material such as aluminum is evaporated on the entire surface of the substrate 1. After that the conductive material is etched away selectively by photoetching techniques to form a conductor 15 which connects the drains 4 and 6, a conductor 16 which connects the source 3 and a power source (not shown), a conductor 17 which connects the source 5 and a power source (not shown), a conductor 18 which connects gate electrodes 7 and 8, a conductor 19 which is connected to the conductor 18 and a conductor 20 which is connected to the conductor 15 to take out an output signal.

In the above described steps, mask alignment is also necessary relative to the N type regions 3, 4 and 21 and thus let us suppose the conductors 15, 16, 17, 18, 19 and 20 are also displaced by $-a$ in the X direction.

In order to consider the relative displacements of the patterns and for convenience of explanation, the following suppositions will be made. The minimum required space between the drain region 6 and the stopper 22 is $bp$. The overlapping margin of the gate oxide film 10 and the drain region 6 or source region 5 is $cp$. The space margin between the drain region 6 and the opening 12 is $dp$. The overlapping margin of the gate electrode 8 and the drain region 6 or the source region 5 is $ep$. The overlapping margin of the stopper 22 and the elongated portion of the gate electrode 8 is $fp$. The depths of the source region 5 and the drain region 6 are X; and the expansion in the lateral direction of these is $\alpha.xj$. The distance between the drain 6 and the stopper 22 which is required from the standpoint of the operating characteristics of the element is $h$.

Under these assumptions, it is understood that the spaces or margins $bp$, $cp$, $dp$, $ep$ or $fp$ are required to satisfy the following equations:

$$bp \geq h + a + 2\alpha \cdot Xj,$$

$$cp > 2 \cdot a - \alpha \cdot Xj$$

$$dp > 2 \cdot a - \alpha \cdot Xj$$

$$ef > 2 \cdot a - \alpha \cdot Xj$$

$$fp > 2 \cdot a - \alpha \cdot Xj.$$

Here, $a$ is usually 1.5 $\mu$ to 3 $\mu$ and $\alpha \cdot Xj$ is several tenths to seven tenths micron.

In FIG. 2F, $bp$ is reduced by the amount of the sum of $2\mu \cdot Xj$, which represents the lateral expansion of the stoppers 21 and 22, and the displacement a which occured in the step shown in FIG. 2C. Thus the allowable minimum space becomes:

$$bp - (a + 2\alpha \cdot Xj) = h.$$

With respect to $cp$, this is also reduced by the amount $2a$, which represents the displacement which occurred in the steps shown in FIGS. 2C and 2D. Therefore, the allowable limit of the margin $cp$ becomes:

$$cp - (2a + \alpha \cdot Xj) = 0.$$

With respect to $dp$, the allowable limit of this space margin becomes:

$$dp - (2a + \alpha \cdot Xj) = 0$$

due to the displacement which occurred in the steps shown in FIGS. 2C and 2E. With respect to the *ep*, the allowable limit of this overlapping margin becomes:

$$ep - (2a + \alpha \cdot Xj) = 0$$

due to the displacement which occurred in steps shown in FIGS. 2C and 2F.

Thus, in the conventional photoetching technique, the old pattern is used as a standard when a new pattern is formed and the relative displacement between the old and new patterns becomes extremely complex requiring further margins for spacing or alignment errors. For these reasons, there are limits to the miniaturization of patterns formed on substrates and the minimum overlapping or spacing margins between different patterns to permit adequate separation of the patterns. In manufacturing for integrated circuits, these limitations become especially troubling obstacles to minuturization of the circuits and cause decreasing yield rates.

SUMMARY OF THE INVENTION

Accordingly, it is an object of the invention to provide a new and improved method of exactly forming minute elements on a substrate without relative displacement thereof.

Another object of the present invention is to provide a new and improved method of facilitating reduction of spacing between elements and lessening the overlapping margin of the different patterns thereby increasing integration rates.

Still another object of the present invention is to provide a new and improved method which increases the yield rate of output products in the manufacture of integrated circuits and the like.

Briefly, in accordance with the present invention, the foregoing and other objects are attained by a method of manufacturing semiconductor devices which includes the steps of forming an insulating film on one surface of a semiconductor substrate, removing the insulating film selectively to expose one surface of the semiconductor substrate, forming a low temperature oxide film containing a first diffusion source which has a higher etch rate than the insulating film onto at least a part of the exposed surface while leaving the rest of the surface exposed, and heating the substrate to diffuse both the first diffusion source and a second diffusion source through the exposed surface.

BRIEF DESCRIPTION OF THE DRAWINGS

These and other objects and features of the invention will be better understood by reference to the following detailed description when considered in connection with the accompanying drawings, wherein:

FIGS. 8A through 8C illustrate a sixth embodiment of the present invention, in which FIG. 8A and 8B are perspective views of a semiconductor substrate and FIG. 8C is a fragmented cross-sectional view thereof cut along the line A—A' shown in FIG. 8B.

DETAILED DESCRIPTION OF THE PREFERRED EMBODIMENTS

While the invention is applicable to a wide variety of semiconductor devices it is readily applied to integrated circuits including a complementary inverter circuit formed on a substrate and will now be described in detail in terms of such integrated circuits.

Figure 3A:
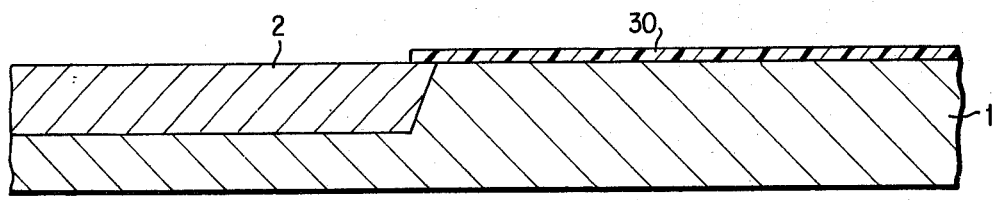
FIGS. 3A through 3E are fragmented cross-sectional views of a semiconductor substrate in the manufacturing process of an integrated circuit, according to a first embodiment of the present invention.

Referring now to the drawings, wherein like reference numerals indicate identical or corresponding parts throughout the several views and more particularly to FIG. 3A thereof, an N type silicon substrate 1 is shown as including a P type diffused region 2 with an electrically insulating film 30 deposited on one face thereof. The impurity density of the substrate 1 may be $10^{14}$ to $10^{16}$ cm$^{-3}$ and of the P type diffused region 2 may be $10^{15}$ to $10^{17}$ cm$^{-3}$. The substrate 1 is then subjected to a heat treatment to form an insulating film 31. The insulating films 30 and 31 may be composed of $SiO_2$, $Al_2O_3$ or $Si_3N_4$. In this embodiment, the insulating film 31 is formed by heating the substrate 1 at a high temperature on the order of 1000° to 1200° C.

Figure 3B:
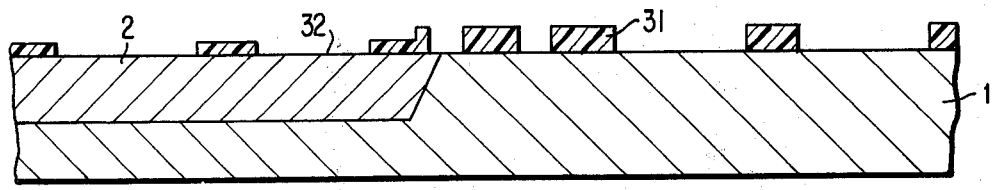

Subsequently, the limited areas of the substrate 1 at which the N type impurity diffusion is to take place are bared by photolithographic masking and etching techniques (FIG. 3B).

Figure 3C:
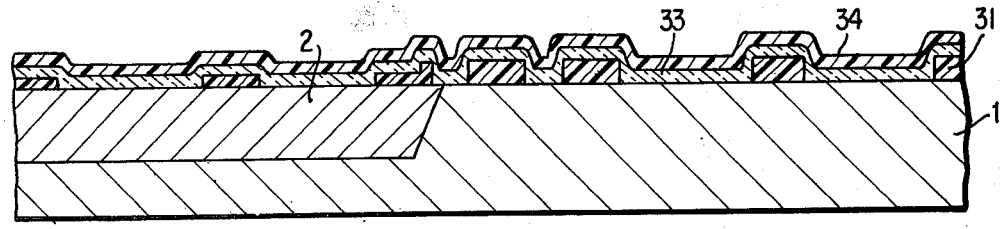

Thereafter, a phosphosilicate glass film hereinafter called PSG film 33 containing phosphor as a first diffusion source, which is the impurity to be diffused, is formed over both the exposed surface of the substrate 1 and the insulating film 31. The PSG film 33 is formed at a low temperature on the order of 300° C to 500° C. A chemical vapor disposition film (hereinafter called C V D film) 34 is then formed on the entire surface of the glass film 33 from gaseous reactants silane and oxygen at a low temperature on the order to 400° C to 500° C (FIG. 3C). The C V D film 34 is used to prevent reverse diffusion from the PSG film 33 during the diffusion step. The laminated films, that is, the PSG film 33 and the C V D film 34 will hereinafter be called the "low temperature oxide film".

Figure 3D:
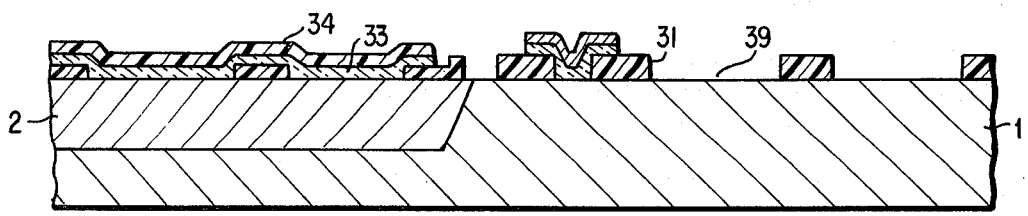

Then, the limited areas of the substrate 1 at which the diffusion of the P type impurity is to take place are exposed by photolitographic masking and subsequent etching techniques (FIG. 3D). In this photoetching process, $NH_4F$ is used as an etchant. The etchant removes the selected portion of the PSG film 33 at a rate more than 4 to 10 times the rate at which the insulating flim 31 (in this embodiment an $SiO_2$ film) is removed. Therefore, the configuration of the insulating film 31 is not significantly changed.

As clearly understood from the above description, it is necessary that the insulating film 31 have a lower etch rate than that of the low temperature oxide film, or should be formed of a substance which is unetchable by the etchant used to etch the low temperature oxide film.

The diffusion treatment is then effected. The silicon substrate 1 is placed into a diffusion furnace and heated to the diffusion temperature of 850° to 1100° C.

Figure 3E:
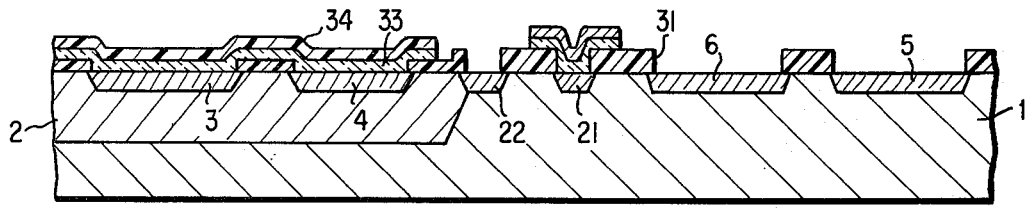

During the diffusion process, a P type impurity such as boron nitride or boron oxide is also introduced into the furnace as a second diffusion source in such a manner as is well known in the art. Thus, N type diffused regions that is, an N type source region 3 and a drain region 4 of the N channel insulated gate field effect transistor (IG-FET) and an N type stopper 21 are formed on the substrate 1 by the diffusion of the N type impurity contained in the PSG film 33 through the openings 32. P type diffused regions, that is, a P type source region 5 and a drain region 6 of the P channel IG-FET and a P type stopper 22 are formed by the diffusion of the P type impurity through the openings 39 (FIG. 3E).

Figure 1:
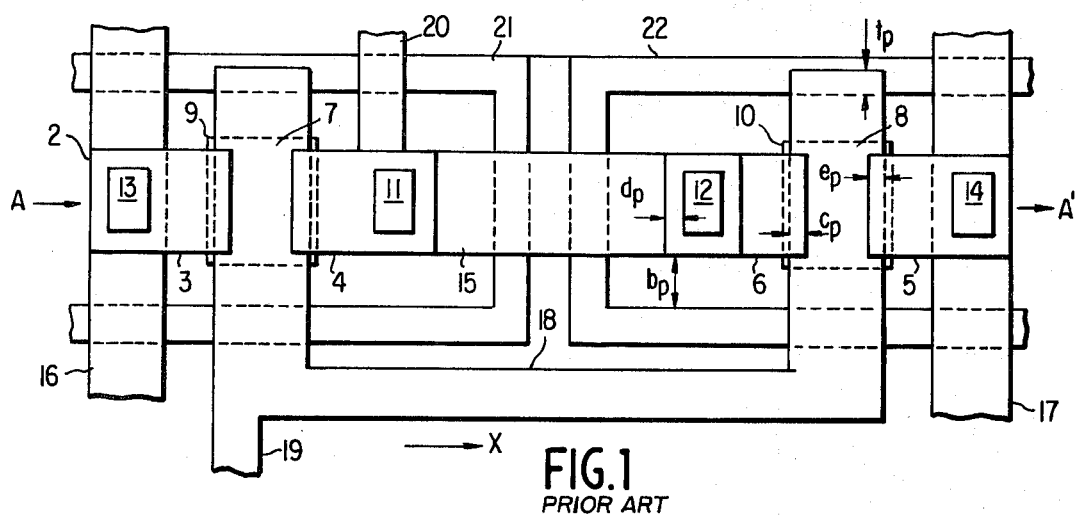
FIG. 1 is a plan view of a conventional integrated circuit including complementary inverter circuits.
Figure 2A:
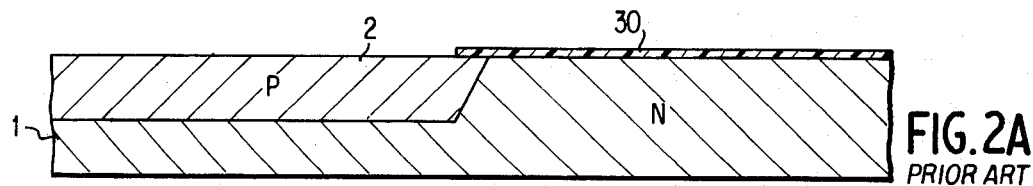
FIGS. 2A through 2F are fragmented cross-sectional views of an integrated circuit formed in accordance with the conventional process.
Figure 2B:
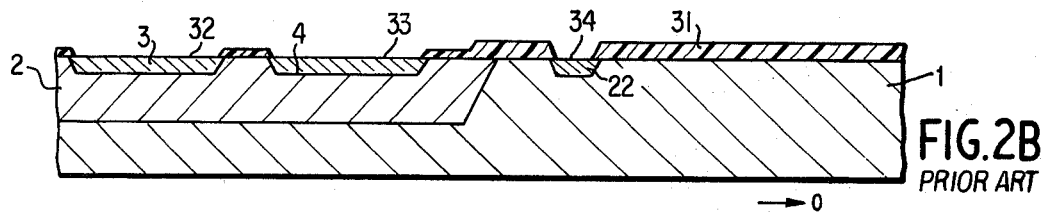
Figure 2C:
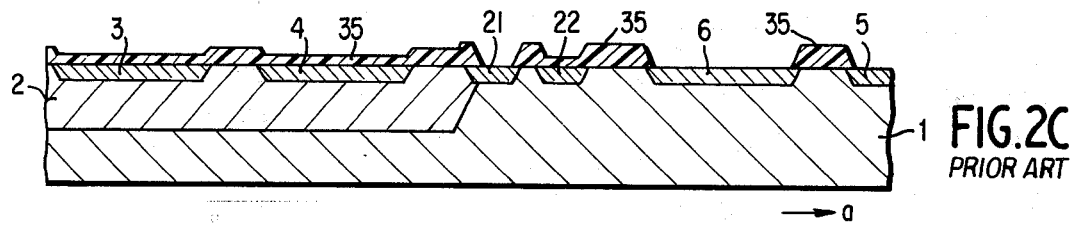
Figure 2D:
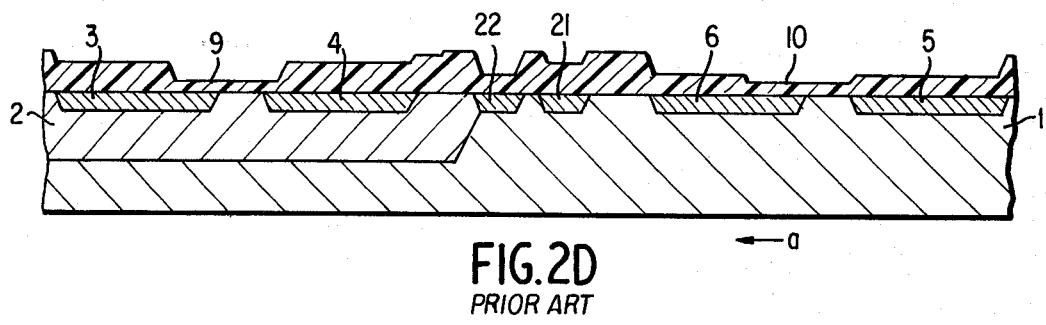
Figure 2E:
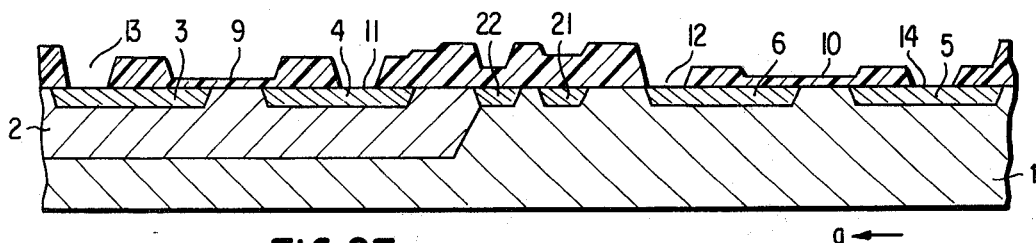
Figure 2F:
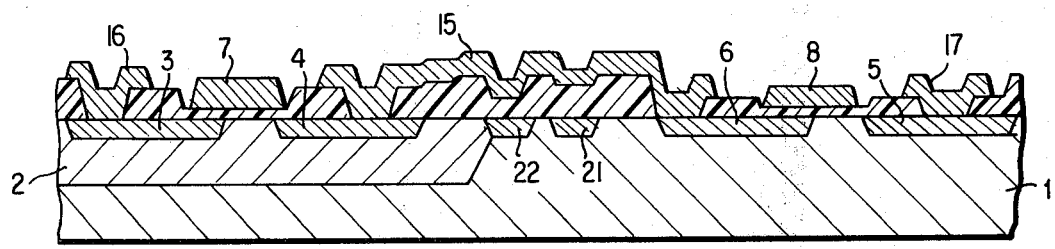

Thereafter gate electrodes 7 and 8 and conductors 15, 16, 17, 18, 19 and 20 are formed by the same process as shown in FIGS. 2D through 2F. Thus the complementary inverter circuit as shown in FIG. 1 is formed.

Figure 4A:
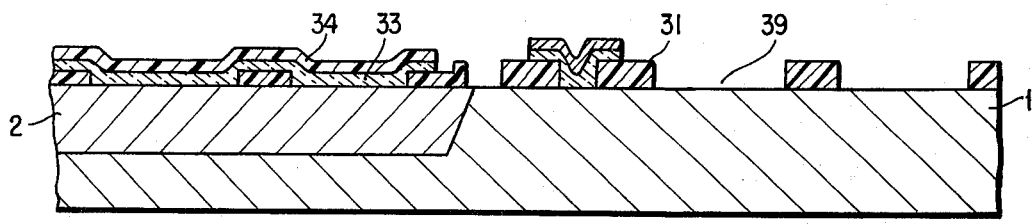
FIGS. 4A through 4C show similar semiconductor substrates illustrating a second embodiment of the present invention.
Figure 4B:
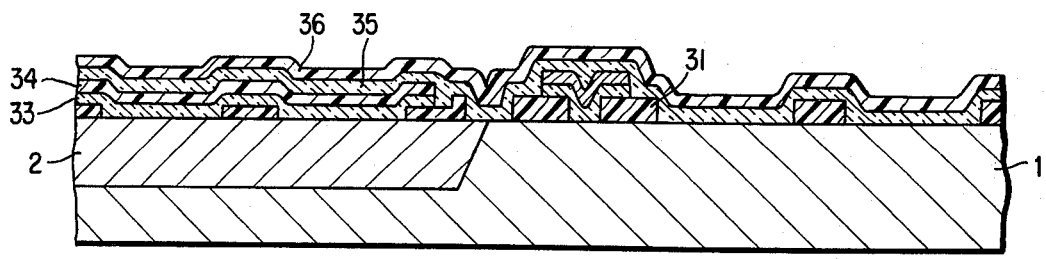
Figure 4C:
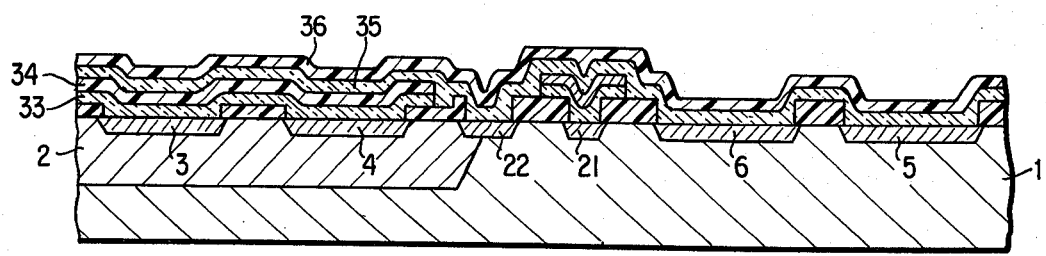

FIGS. 4A through 4C show a second embodiment of the present invention.

FIG. 4A shows the arrangement after the P type diffused region 2, the PSG film 33, containing phosphor as a first diffusion source, and the C V D film 34 have been formed on the substrate 1 in accordance with the same process as shown in FIGS. 3A through 3C. In this embodiment, the laminated film consisting of the combined PSG and C V D films 33, 34 will be called the "first low temperature oxide film" for the reason explained above. Then a borosilicate glass film hereinafter called a BSG film 35 containing boron as a second diffusion source which is the impurity to be diffused, is coated on the substrate 1, the high temperature insulating film 31 and the first low temperature oxide film 33 and 34 as shown in FIG. 4B.

A further C V D film 36 is coated on the entire surface of the BSG film 35 (FIG. 4B). This laminated film, BSG film 35 and C V D film 36 will be called the "second low temperature oxide film" in the present invention.

Thereafter, the substrate 1 is put into the diffusion furnace and is heated in accordance with conventional practice. By this heat treatment, an N type source region 3 and a drain region 4 of the N channel IG-FET, a P type source region 5 and a drain region 6 of the P channel IG-FET, an N type stopper 21 and a P type stopper 22 are formed (FIG. 4C).

After that, gate electrodes 7 and 8 and conductors 15, 16, 17, 18, 19 and 20 are formed by the same process as shown in FIGS. 2D through 2F. Thus the complementary inverter circuit as shown in FIG. 1 is obtained.

As explained in the above embodiment, it is preferable to apply the PSG film 33 first on the substrate and then the BSG film 35 in order to maintain the configuration of the insulating oxide film 31 which is left selectively on the substrate. The reason for this is that the etching rate of the PSG film is from several times faster to several tens of times faster than that of the insulating oxide film. Also the etching rate of the PSG film is faster than that of the BSG film. Therefore, if the BSG film is formed on the insulating film first, it will take a long time to etch away the BSG film, which causes deformation of the insulating oxide film.

Figure 5A:
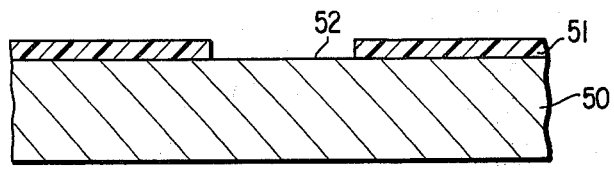
FIGS. 5A through 5C illustrate a third embodiment of the present invention.
Figure 5B:
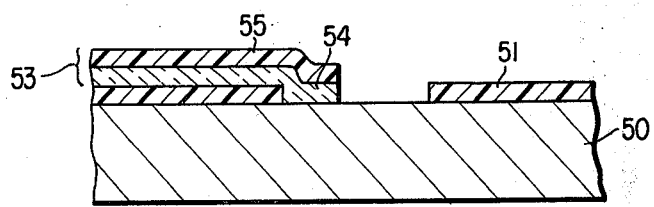
Figure 5C:
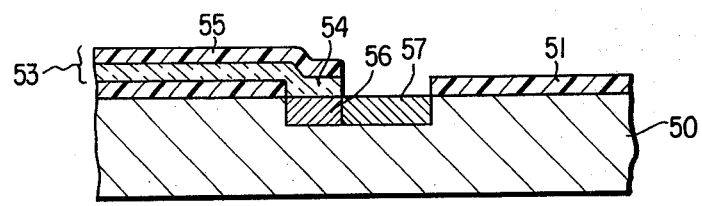

FIGS. 5A through 5C show a third embodiment of the present invention.

FIG. 5A shows the arrangement after an insulating film 51, which formed on the N type silicon substrate 50, is etched away partially to make an opening 52. Then a low temperature oxide film 53 which consists of a PSG film 54 and a C V D film 55 is formed on the insulating film 51 and a part of the opening 52 (FIG. 5B). The substrate 50 is subsequently put into the diffusion furnace and is heated. During this diffusion process, an N type diffusion source such as boron is introduced into the furnace. Therefore, an $N^+$ type diffused region 56 is formed by the diffusion of phosphor contained in the PSG film 54 and a P type diffused region 57 is formed by the diffusion of the boron through the opening 52 (FIG. 5C). Thereafter, electrodes (not shown) are formed on the regions 56 and 57. Thus a protective diode circuit is formed.

Figure 6A:
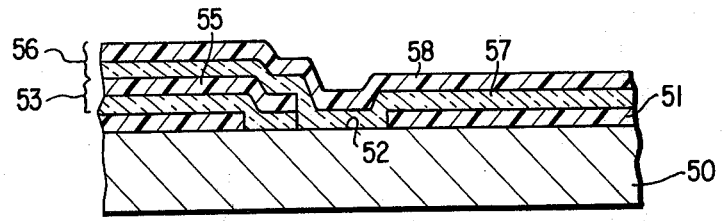
FIGS. 6A and 6B illustrate a fourth embodiment of the present invention.
Figure 6B:
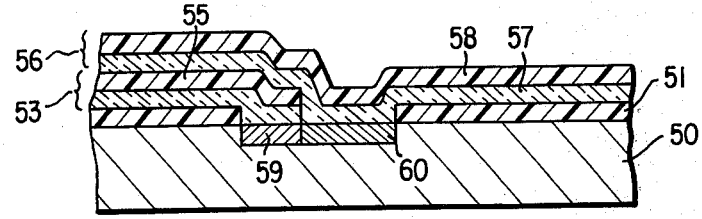

FIGS. 6A and 6B show a fourth embodiment of the present invention. First, the steps shown in FIG. 5A and 5B are repeated. Then, a second low temperature oxide film 56 which consists of a BSG film 57 and a C V D film 58 is formed on the first low temperature oxide film 53, the opening 52 and the insulating film 51. The substrate 50 is subsequently put into the diffusion furnace and is heated to a diffusion temperature thereby forming an $N^+$ type diffused region 59 and a P type diffused region 60 on the single exposed surface 52. After that, the oxide films 53 and 56 are removed and electrodes are attached to the respective regions in the conventional manner.

Figure 7:
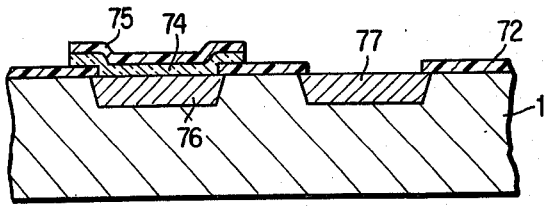
FIG. 7 illustrates a fifth embodiment of the present invention.

FIG. 7 shows a fifth embodiment of the present invention.

FIG. 7 shows the arrangement after the diffusion has been completed. In this embodiment, an N type silicon substrate 71 is covered by an insulating film 72 and then the insulating film 72 is selectively removed. Thereafter a low temperature oxide film 73 consisting of a BSG film 74 and a C V D film 75 is formed. The substrate 71 is subsequently put into the diffusion furnace thereby obtaining a $P^+$ type diffused region 76 by the diffusion of the boron contained in the BSG film 74, as a first diffusion source, and a $P^{++}$ type region 77 by the diffusion of the P type second diffusion source introduced into the furnace.

Figure 8A:
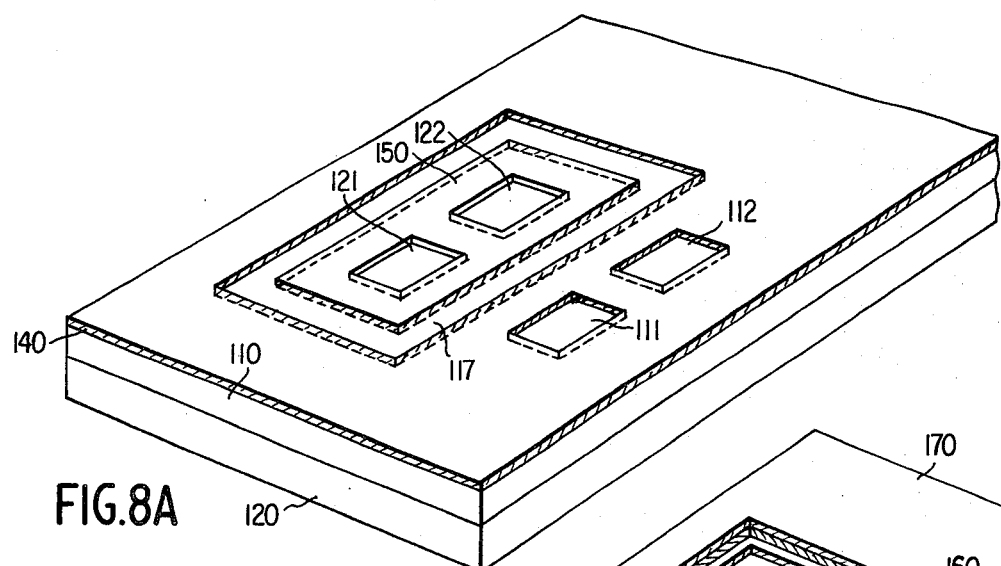
Figure 8B:
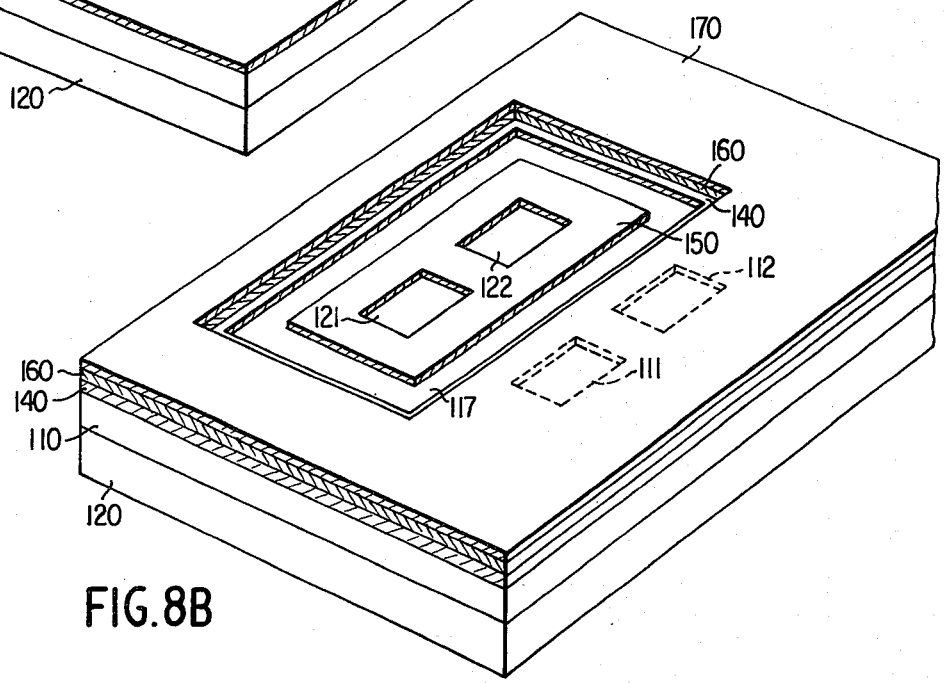
Figure 8C:
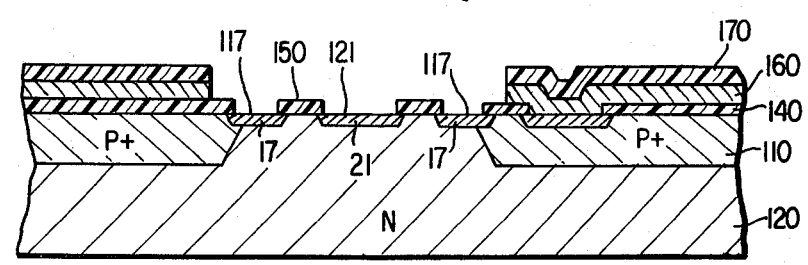

FIGS. 8A through 8C show a sixth embodiment of the present invention in which the formation of a complementary inverter circuit without a stopper region is illustrated.

FIG. 8A shows the arrangement after an insulating film which covered an N type substrate 120 and a P type well region 110 is removed selectively by photoetching to form windows 111, 112, 117, 121 and 122. The window 117, divides the insulating film into two regions 140 and 150.

A low temperature oxide film consisting of a PSG film 160 which contains the first diffusion source, and a C V D film 170 is then formed on the insulating film 140 and windows 111 and 112 (FIG. 8B). Thereafter the substrate 120 is put into a diffusion furnace, in which a P type impurity, as a second diffusion source, is also introduced. A drain region 121 and a source region of a P channel IG-FET, a drain region 111 and a source region 112 of an N channel IG-FET and a P-type guard ring 117 are thus obtained (FIG. 8C).

Figure 9:
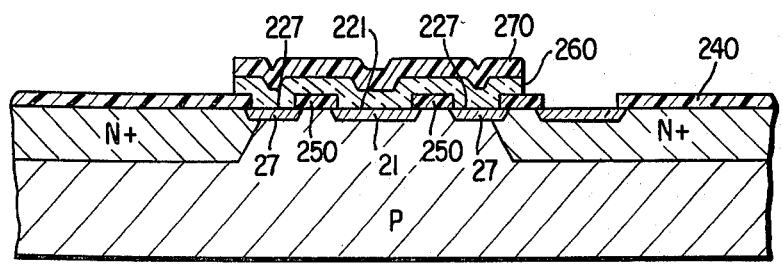
FIG. 9 illustrates a seventh embodiment of the present invention.

In the above embodiment, the N type substrate is used although a P type substrate may also be used. In this case, the conductivity type of all the regions becomes opposite. Therefore the low temperature oxide film is formed only on the windows 227, 211 and 212 and the insulating film 250, as shown in FIG. 9.

As clearly understood from the above description, according to the present invention, the conventional photoetching mask is used only one time to form the diffused regions and the low temperature oxide film is used as a mask during the diffusion process. Therefore, no relative displacement of regions occurs.

While the invention has been particularly shown and described with reference to a preferred embodiment thereof, it will be understood by those skilled in the art that changes in form and details may be made therein without departing from the spirit and scope of the invention. For example, a silicon substrate was used as a low temperature oxide film. It should be understood that other substrates such as sapphire, and a glass film containing other than phosphor or boron as a low temperature oxide film are equally suitable for use in the present invention.

Also the formation of P or N regions such as the diffused region 57 in FIG. 5C may be made by ion implantation. That is, the second diffusion source may be applied to the exposed surface of the substrate by ion implantation.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method of making a semiconductor device comprising the steps of forming an insulating film on a surface of a semiconductor substrate having opposite first and second conductivity portions, selectively removing the insulating film from the first and second conductivity portions to only partially expose the first and the second conductivity portions, forming a first film having a first diffusion source therein on the exposed first conductivity portion and on the exposed second conductivity portion, forming a chemical vapor deposition film on the first film having the characteristic to prevent reverse diffusion of the first diffusion source during diffusion, selectively removing only a portion of the first film and the chemical vapor deposition film from the semiconductor substrate, heating the semiconductor substrate to diffuse the first diffusion source through the first film and into the first and the second conductivity portions and to diffuse a second diffusion source into the semiconductor substrate.

2. A method according to claim 1 wherein the second diffusion source comprises a gaseous phase impurity.

3. A method according to claim 1 wherein a second film comprising the second diffusion source is applied to the exposed portion of the semiconductor substrate after the second selective removal step and wherein a chemical vapor deposition film is formed on the second film.

4. A method according to claim 1 wherein the first film comprises a phosphosilicate glass film.

5. A method according to claim 3 wherein the second film comprises a borosilicate glass film.

6. A method according to claim 1 wherein the second diffusion source is applied to the exposed portion of the semiconductor substrate by ion implantation.

* * * * *

UNITED STATES PATENT AND TRADEMARK OFFICE
CERTIFICATE OF CORRECTION

PATENT NO. : 3,986,896
DATED : October 19, 1976
INVENTOR(S) : Ueno Mitsuhiko et al It is certified that error appears in the above-identified patent and that said Letters Patent are hereby corrected as shown below:

Change to show the first inventor's name from "Ueno Mituhiko" to --Ueno Mitsuhiko--.

Signed and Sealed this

Fifteenth Day of February 1977

[SEAL]

*Attest:*

RUTH C. MASON
*Attesting Officer*

C. MARSHALL DANN
*Commissioner of Patents and Trademarks*